JUNCTION TRANSISTOR THERMOSTAT

Filed Dec. 27, 1955

*INVENTOR.*
LLOYD P. HUNTER

*BY* Alvin J. Riddles
AGENT 2,996,918

JUNCTION TRANSISTOR THERMOSTAT

Lloyd P. Hunter, Poughkeepsie, N.Y., assignor to International Business Machines Corporation, New York, N.Y., a corporation of New York Filed Dec. 27, 1955, Ser. No. 555,454
3 Claims. (Cl. 73—362)

This invention relates to junction transistors and more particularly to the construction of a junction transistor for use in temperature sensitive applications.

The junction transistor as known in the art is an active semiconductor device having three or more zones of alternately different conductivity semiconductor material, each zone forming a rectifying junction with adjacent zones. The more common types of junction transistors have a zone of one conductivity type adjoining two zones of opposite conductivity type to form two rectifying junctions and are known as P-N-P or N-P-N junction units according to the distribution of their P-type and N-type zones. In these units the two outermost zones of like conductivity are termed the emitter and collector zones and the central zone of opposite conductivity is termed the base zone. These devices are capable of current, voltage and power amplification depending on the manner in which they are connected in a circuit. There are three general arrangements for connecting P-N-P and N-P-N junction units as active circuit elements, namely, common emitter, common base and common collector type connections wherein in each case, respectively, the emitter, base or collector zone is connected in common with both the input and output circuits of the device.

It has been determined that these P–N–P and N–P–N junction transistors can be constructed with a high resistivity collector zone and when such transistors are operated in the common emitter type of circuit configuration they exhibit very great sensitivity to temperature variations. The base input current gain of transistors having a high resistivity collector zone is extremely dependent upon temperature and may be made to approach infinity for selected temperature values.

Accordingly a primary object of this invention is to provide an improved semiconductor temperature sensitive device.

Another object of this invention is to provide a three zone junction transistor having a base input current gain that is temperature sensitive.

Still another object of this invention is to provide a junction transistor thermostat operable to deliver a large output signal at a selected temperature.

Still another object of this invention is to provide a three zone junction transistor having an overall current gain greater than unity.

Other objects of the invention will be pointed out in the following description and claims and illustrated in the accompanying drawings, which disclose, by way of example, the principle of the invention and the best mode, which has been contemplated, of applying that principle.

Figure 1:
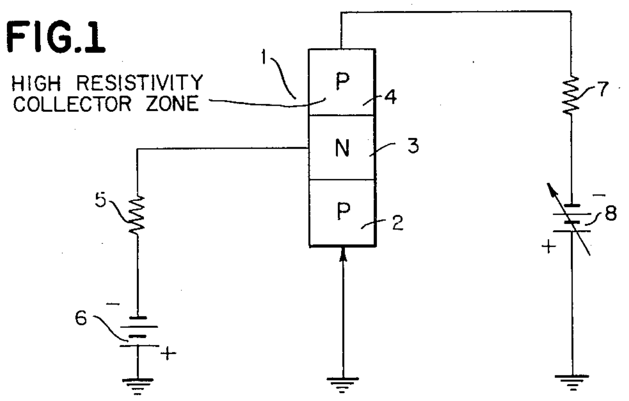
FIGURE 1 is a schematic diagram of a circuit arrangement employing the transistor of this invention for indicating a change in temperature.

A transistor having a sufficiently high collector zone resistivity according to this invention, when operating with the emitter zone connected in common with both the input and output circuits of the transistor, is very sensitive to temperature changes and variations in temperature may allow the overall gain of the transistor to equal or exceed unity. This action may be contrasted with conventional N-P-N or P-N-P junction transistors known in the art in that the overall gain of such conventional transistors is theoretically unity and in practice, due to internal losses in the transistor, is always less than unity. The high resistance collector region provided in this transistor produces a sweeping field in the vicinity of the collector and this field permits the overall gain of this transistor to be unity or greater in practice with a theoretical upper limit yet to be established as will be explained in greater detail hereafter.

Any technique capable of providing the collector region with a high resistivity may be used, and one satisfactory method, for example, is the standard double doping technique used in the transistor art. In this technique a semiconductor seed crystal is immersed in a melt of the same type semiconductor material and is withdrawn slowly to permit the material of the melt to continuously solidify on the face of the seed crystal and cause growth. The resistivity and the conductivity of the formed crystal are controlled by adding certain conductivity directing impurity materials to the melt at progressive stages of the crystal growing operation. In forming a semiconductor crystal from which a high resistivity collector transistor may be cut, a melt is first prepared of semiconductor material such as silicon or germanium to which has been added predetermined quantities of N type or P type conductivity directing impurity materials, for example elements of groups III and V of the periodic table. The predominance of either N or P type conductivity directing impurity material determines the type of conductivity obtained and the net quantity of such impurities in the grown crystal controls the desired resistivity. A seed crystal is brought in contact with the melt and slowly removed, permitting material from the melt to solidify on the seed crystal as it is withdrawn. When a desired length of crystal has been grown in this manner to give a collector region of reasonable size, a further quantity of one impurity is added to the melt sufficient to change the preponderance of impurities in the melt and accordingly the conductivity type in the growing crystal. This addition of impurities to the melt is known as doping. This is accomplished so as to increase the net number of impurities in the grown crystal so that the resistivity of the crystal region thereafter grown from the melt will be lower than that previously grown. The crystal growing continues for as long a time as is required to produce the desired base region thickness and when this has been achieved, the melt is doped a second time with more impurities of the type required to reconvert the conductivity type to that provided in the original melt. This last addition again alters the net impurity content so as to lower the resistivity, of the growing crystal. The crystal formation is continued until a desired length of crystal has been grown of sufficient length to give an emitter region of reasonable size. A single semiconductor crystal containing three zones of alternately opposite conductivity has thus been produced with the successive zones having progressively decreasing zone resistivities. N-P-N or P-N-P transistors may be cut from the crystal. If nearly pure semiconductor is used for the starting melt it is possible, by closely controlling the quantities of impurities added, to grow a section of crystal of any desired resistivity and to produce a desired resistivity gradient in a particular section of a crystal.

Referring now to FIGURE 1 a high resistivity collector P-N-P transistor 1 is shown connected in a circuit as to give indication of temperature changes. The transistor 1 has three zones 2, 3 and 4 serving as emitter, base and collector respectively. The emitter zone 2 is connected to ground. The base zone 3 is connected through resistor 5 and battery 6 to ground so that there is provided a source of constant base input current. The collector zone 4 is connected through a suitable load impedance, shown schematically as resistor 7, to the negative terminal of variable power and bias battery 8. The positive terminal of battery 8 is grounded. The selection of resistor 7 as the collector circuit load impedance is done for illustration purposes only, it being understood that the use of the current flowing through any collector load impedance or the use of the voltage developed across it for control purposes may readily be accomplished by one skilled in the art.

The high resistivity collector transistor 1 when connected as shown in FIGURE 1 has a base input current gain that is highly dependent upon temperature and collector voltage. This gain becomes infinite when the overall gain of the transistor 1 reaches unity and the temperature at which the base input current gain becomes infinite may be controlled by varying the collector operating voltage, as by varying the output of the battery 8. At a given temperature, the constant current supply comprising the series connected battery 6 and resistor 5 provides a constant base input current to the transistor 1 which results in a constant collector current in the output circuit flowing through impedance 7. When an increase in temperature takes place, the base input current remains constant but the current through impedance 7 increases sharply and may go to a value limited only by the total forward impedance of the collector circuit. The temperature at which this increased current flow is obtained may be controlled by varying the collector operating voltage through the battery 8. Thus, with this high resistance collector transistor, a thermosensitive circuit can be constructed that will deliver an output current that changes sharply with temperature variations and that will deliver an essentially short circuit output current for a selected temperature. The reason that this is true and the method of determining the range of collector resistivities at which it is true will be apparent from the following brief discussion of the gain of P-N-P or N-P-N junction transistors wherein the explanation provided is directed particularly to direct current applications although a similar alternating current scheme could easily be visualized by those skilled in the art.

It is established in the art that the overall current gain of a P-N-P or N-P-N junction transistor is the change of collector current with respect to changes of emitter current, at constant collector voltage. This gain is referred to as $\alpha$ and may be considered to be the product of three factors. These factors are the injection efficiency of the emitter junction, the transfer efficiency of the base zone and the innate collector efficiency. These three factors are referred to as $\gamma$, $\beta$ and $\alpha^*$ respectively.

First, considering the injection efficiency of the emitter junction, $\gamma$, this factor is generally computed for a P-N-P transistor from the following expression.

$$\gamma=\left(1+\frac{\rho_e W}{\rho_b L_n}\right)^{-1}$$

Employing the reference labels used in FIGURE 1 these factors are as follows:

$\rho_e$ is the resistivity of the emitter zone 2.
$\rho_b$ is the resistivity of the base zone 3
W is the width of the base zone 3 and
$L_n$ is the diffusion length for electrons in emitter zone 2.

Since the above expression is a reciprocal, the denominator of which can never be less than one, then the value of this expression has a theoretical maximum value of unity and for most junctions this value is very close to unity, for example .99.

Considering next the transfer efficiency of the base region $\beta$, the primary controlling element determining the value of this factor is the injected carrier recombination in the base region. Since the optimum condition for this factor would be zero recombination so that all injected carriers were transferred to the collector barrier, then the theoretical maximum value of this factor would be unity.

The innate collector efficiency factor $\alpha^*$ is a measure of the ability of the transistor to control current flow through the collector junction as a result of the influence of minority carriers arriving at the junction. In the case of the transistor of FIGURE 1 it is the change of collector current with changes of hole current through the collector junction and since the quantity of collector current is determined directly by the injected holes, on a hole for electron basis, the normal limit of $\alpha^*$ would be unity if no extra electrons are liberated by the arriving holes. In the temperature sensitive junction transistor of this invention the high resistivity collector region produces a field in the collector region which is capable of releasing some extra electrons from the collector region through the collector junction and causes the $\alpha^*$ of the transistor to exceed unity.

Since the overall current gain $\alpha$ of a P-N-P or N-P-N junction transistor is the product of these three factors $\gamma$, $\beta$ and $\alpha^*$, if each of these factors is less than or equal to unity as in a conventional N-P-N or P-N-P transistor then the product cannot exceed unity. In the case of the high resistivity collector transistor of this invention the $\alpha^*$ of greater than unity makes it possible to have the overall current gain $\alpha$ equal or exceed unity so long as $\alpha^*$ makes up for losses in $\gamma$ and $\beta$. In other words $\alpha$ will be unity or greater when $$\alpha^*\geq\frac{1}{\gamma\beta}$$

It is also established in the art that the base input current gain of a P-N-P or N-P-N transistor, when operating in the common emitter type of connection as shown in FIGURE 1, is the overall current gain $\alpha$ divided by the quantity 1 minus the overall current gain $\alpha$. Hence, if $\alpha$ reaches unity the value of the base input current gain, commonly expressed as $\alpha'$, becomes infinite. The practical result of this with respect to the circuit of FIGURE 1 is that the current through the impedance 7 will be limited only by the total forward impedance of the collector circuit, of which the impedance 7 is a part.

Considering the manner in which $\alpha'$ is influenced by $\gamma$, $\beta$ and $\alpha^*$ it has been found that $\alpha'$ is the algebraic sum of these three factors and it may be expressed as the reciprocal of the losses from each factor as follows:

$$\alpha'=\left(\underset{(1)}{\frac{\rho_e W}{\rho_b L_{ne}}}+\underset{(2)}{\frac{A_s S W}{A_e D_p}}+\underset{(3)}{\frac{W^2}{2L_{Pb}^2}}-\underset{(4)}{\frac{N_c\mu_n}{2P_c\mu_p}}\right)^{-1}$$

where:

$\rho_e$ is emitter zone resistivity
$\rho_b$ is base zone resistivity
W is width of the base region
$L_{ne}$ is diffusion length for electrons in the emitter region.
$A_s$ is the surface area of the base region surrounding the emitter junction or the total surface area of the base region depending on the geometry of the transistor.
S is the surface recombination rate constant.
$A_e$ is the area of the emitter junction
$D_P$ is the diffusion constant for holes
$L_{Pb}$ is the lifetime of holes in the base
$N_c$ is the concentration of electrons in the collector region.
$P_c$ is the concentration of holes in the collector region.
$\mu_n$ is the mobility of electrons in the collector region.
$\mu_p$ is the mobility of holes in the collector region.

In the above expression term 1 corresponds to the loss in the transistor due to $\gamma$, terms 2 and 3 are the losses due to surface recombination and bulk recombination respectively and together represent the loss due to $\beta$ and term 4 corresponds to the innate collector efficiency $\alpha^*$. From the above expression it will be apparent that when the sum of terms 1, 2 and 3 is equal to term 4, $\alpha'$ will be infinite. However, since terms 1, 2 and 3 each represent losses then the sum of these losses must be made up by the term 4. This is now possible with the novel transistor of this invention because the high resistivity collector zone gives a reasonably large $N_c/P_c$ and permits term 4 to become equal to the sum of terms 1, 2 and 3. Physically this means that there will be a field in the vicinity of the collector barrier that increases the ratio of electrons to holes passing through the collector barrier.

It has been found that where $\rho_e$ and $\rho_b$ are equal or less than $\rho_c$ as in the transistor of this invention, the only term in the above expression that is appreciably affected by heat is the $N_c/P_c$ portion of term 4 and that the electron to hole ratio in this transistor is so sensitive to temperature that term 4 varies from 0 at low temperatures to 1 at high temperatures. It is known in the art that when an operating collector voltage is applied across a collector barrier that a depletion layer is set up along the barrier. This depletion layer thickness varies with the square root of the applied voltage and extends itself both into the collector and the base regions according to the ratio of the respective resistivities of these regions. The width W of the base region will therefor be decreased by this effect and term 1 will be reduced.

It should also be noted that since the ratio of electrons to holes in the collector region determines the magnitude of term 4 and that this ratio varies directly with resistivity, then further control on the temperature at which $\alpha'$ becomes infinite may be had by providing a resistivity gradient in the high resistivity collector region so that the resistivity increases from one value at the collector barrier to greater values as the distance from the barrier increases. The effect of this then is that the depletion layer produced by the operating collector voltage now not only encroaches on the thickness of the base region but the portion of it in the collector region introduces an increased value of $N_c/P_c$.

In view of these facts it will be apparent that $\alpha'$ of this transistor will become larger with increasing temperature and can be made to go to infinity at a selected temperature by choosing the operating collector voltage or a combination of operating collector voltage and graded resistivity collector region so as to cause terms 1, 2 and 3 of the above expression for $\alpha'$ to equal term 4 at that temperature.

In summary of the above paragraphs the high resistivity collector region of the transistor of this invention produces a field in the vicinity of the collector barrier and the presence of this field permits the overall current gain of this transistor to equal or exceed unity. The effect of this is that the base input current gain of a transistor with a high resistivity collector zone is very sensitive to the factors of temperature and operating collector voltage and the ability of this transistor to have an overall current gain of greater than unity permits the utilization of the sensitivity to these factors to produce a novel and improved temperature sensitive device.

To illustrate the above teaching and to aid in understanding and practicing the invention the following set of specifications are established for the transistor of FIGURE 1. These are included with the understanding that the scope of the invention is not to be limited thereby since, in accordance with the above teaching, a wide range of such specifications are possible in providing N-P-N or P-N-P junction transistors with a collector zone resistivity sufficiently high in relation to that of the adjacent base zone to produce a field in the vicinity of the collector barrier that is of sufficient intensity to increase the ratio of electrons to holes in the collector zone to a value that, multiplied by the mobility ratio for the particular semiconductor material, this product may equal the combined losses in the transistor that affect the overall current gain. It has been found that for a germanium N-P-N transistor having the zone of high resistivity serving as the collector a resistivity of 1.7 ohm centimeters is sufficient to cause $\alpha^*$ to equal unity and that for a similar P-N-P transistor a resistivity of 2.3 ohm centimeters is sufficient.

In a specific embodiment, the transistor of FIGURE 1 may be of germanium with specifications as follows:

$\rho_e$=.1 ohm cm.
$\rho_b$=5 ohm cm.
$\rho_c$=5 ohm cm.
$L_{ne}$=.01 cm.
$W$=.004 cm.
$A_e$=0.1 cm.$^2$
$A_s$=0.0016 cm.$^2$
$D_p$=47 for germanium
$S$=500 cm./sec.

$$\frac{\mu_n}{\mu_p}=2 \text{ for germanium}$$

Figure 2:
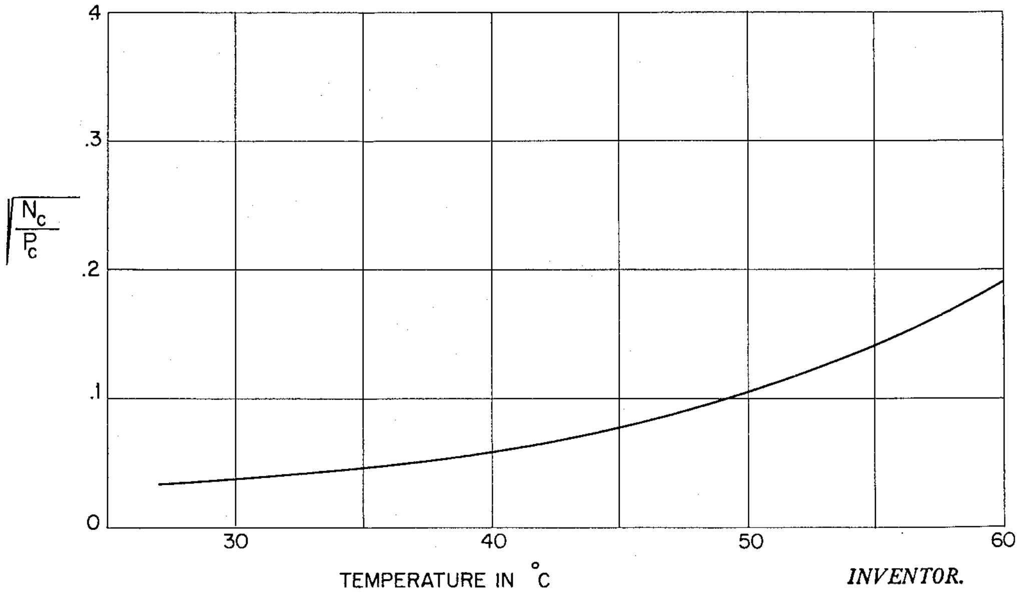
FIGURE 2 is a graph showing the variation of the ratio of electrons to holes in the collector zone plotted against temperature for a typical high resistivity collector zone N-P-N or P-N-P junction transistor.

Referring now to FIGURE 2 a curve showing the variation, with temperature, of the ratio of electrons to holes in the collector zone of the transistor specified above is shown. This curve is a non-linear function with temperature and illustrates the sensitivity of $N_c/P_c$ to temperature change.

The values for this curve have been established from the following expression:

$$\sqrt{N_c/P_c}=\frac{\frac{\mu_n}{\mu_p}+1\pm\sqrt{\left(\frac{\mu_n}{\mu_p}\right)^2-4\frac{\mu_n}{\mu_p}\left(\frac{\rho_c}{\rho_i}\right)^2}}{2\frac{\mu_n}{\mu_p}\quad\frac{\rho_c}{\rho_i}}$$

where $$\frac{\mu_n}{\mu_p}$$

is the ratio of the mobilities of electrons and holes in the semiconductor material and $$\frac{\rho_c}{\rho_i}$$

is the ratio of collector zone resistivity to intrinsic semiconductor material resistivity. This ratio varies with temperature.

For the transistor of this embodiment operating at a collector voltage of −5 volts and a temperature of 30° centigrade, the base input current gain $\alpha'$ as derived from the aforementioned equation therefor, would be expressed as shown below. Wherein term 3 is assumed to be negligible $$\alpha'=\frac{1}{\left(\frac{\rho_e W}{\rho_b L_{ne}}+\frac{A_s S W}{A_e D_p}\right)-\left(\frac{N_c}{2P_c}\ \frac{\mu_n}{\mu_p}\right)}$$

W for this illustration of a typical transistor of the type of this invention may be determined by calculating the increase in width of the part of the depletion region associated with the collector barrier that extends into the base zone as a result of the operating collector voltage and subtracting it from the designed width of the base region. In this illustration since the respective resistivities of the base and collector zones are equal the effect of the depletion region will extend equally on both sides of the collector barrier and the effect in any one zone will be half of the total. Hence the increase in width of the depletion region in the base zone will be as follows:

$$\Delta W_{\text{Depletion}}=\frac{\left(\frac{Vc}{2}\rho_c\right)^{1/2}}{25}\quad(2.5)\text{ centimeters}$$

$$\Delta W_{\text{Depletion}}=\frac{\left(\frac{5}{2}5\right)^{1/2}}{25}\quad(2,5)=.0002\text{ centimeter}$$

Then $$W_{\text{Effective}} = W - \Delta W_{\text{Depletion}} = .004 - .0002 = .0038 \text{ cm.}$$

$\alpha'$ may now be calculated as follows:

$$\alpha' = \frac{1}{\left(\frac{.1\times .0038}{5\times .01} + \frac{.0016\times 500.\times .0038}{0.1\times 47}\right) - (.0016\times 2)}$$

$$\alpha' = \underset{(1)}{(.0075} \quad \underset{(2)}{+.0065)} - \underset{(4)}{(.0032)} \quad = 91$$

At this temperature term 4 is less than the sum of terms 1 and 2 and $\alpha'$ has a finite value.

As the temperature rises, as may be seen from FIGURE 2, $N_c/P_c$ increases and may cause $\alpha'$ to exceed unity. This is illustrated in the following calculation where the sum of terms 1 and 2 are set equal to term 4.

$$\alpha' = \frac{1}{(.0075 + .0065) - (.014)} = \frac{1}{0} = \infty$$

and $(.014)^{1/2}$ from FIGURE 2 is at 51.4° C.

At this temperature the transistor will deliver a large output signal.

Continuing further, assuming a desire for a large signal to be delivered at 50° C. If the operating collector voltage were increased to 50 volts the following would obtain.

W effective would decrease to .0029 cm. and $\alpha'$ would equal infinity at 49.4° C.

Hence, with a very slight decrease in operating collector voltage W effective may be increased to the point where $\alpha' = \infty$ at 50° C.

The above calculations and adjustments may be performed readily by anyone skilled in the art employing the above described principles.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A transistor thermostat comprising: in combination, a junction transistor having emitter and collector outer zones of one conductivity type separated by an inner base zone of the opposite conductivity type and forming a junction barrier with each said emitter and said collector zones, said collector zone having a resistivity sufficiently high to produce a field in the vicinity of said collector barrier of sufficient intensity to increase the ratio of electrons to holes in said collector zone to a value which multiplied by the mobility ratio of the particular semiconductor material of said transistor may equal the combined losses in the transistor that affect the overall current gain thereof, whereby the alpha of the transistor is below unity below a certain critical temperature and is caused to exceed unity above said certain critical temperature, a constant current base input source, means connecting said base input source between said base and said emitter, an adjustable power source, a load impedance, and means connecting said adjustable power source and said load impedance in series between said emitter and said collector whereby as the temperature increases through said certain critical temperature value there is an abrupt increase in collector current due to transistor amplification of said constant current base input.

2. The transistor thermostat of claim 1 wherein said junction transistor is a PNP type transistor and has a collector resistivity of 2.3 ohm centimeters.

3. The transistor thermostat of claim 1 wherein said junction transistor is an NPN type transistor and has a collector resistivity of 1.7 ohm centimeters.

References Cited in the file of this patent

UNITED STATES PATENTS

| | | |
|---|---|---|
| 2,585,078 | Barney | Feb. 12, 1952 |
| 2,602,763 | Scaff et al. | July 8, 1952 |
| 2,623,105 | Shockley et al. | Dec. 23, 1952 |
| 2,654,059 | Shockley | Sept. 29, 1953 |
| 2,705,767 | Hall | Apr. 5, 1955 |
| 2,727,840 | Teal | Dec. 20, 1955 |
| 2,728,857 | Sziklai | Dec. 27, 1955 |
| 2,753,280 | Moore | July 3, 1956 |
| 2,848,564 | Keonjian | Aug. 19, 1958 |
| 2,871,376 | Kretzmer | Jan. 27, 1959 |

OTHER REFERENCES

Shea: "Principles of Transistor Circuits," Sept. 15, 1953; see pages 12 and 13 (1.35), pages 16, 17, 44–49 and 164–182.

UNITED STATES PATENT OFFICE

CERTIFICATE OF CORRECTION

Patent No. 2,996,918 August 22, 1961

Lloyd P. Hunter

It is hereby certified that error appears in the above numbered patent requiring correction and that the said Letters Patent should read as corrected below.

Column 6, line 11, for "$Ae=0.1\ cm.^2$" read -- $A_e=.01\ cm.^2$ --; column 7, lines 5, 6 and 7, the equation should read as shown below instead of as in the patent:

$$\alpha' = \frac{1}{\left(\frac{.1X.0038}{5X.01} + \frac{.0016X500.X.0038}{.01X47}\right) - (.0016X2)}$$

Signed and sealed this 20th day of March 1962.

(SEAL)
Attest:

ERNEST W. SWIDER
Attesting Officer

DAVID L. LADD
Commissioner of Patents